United States Patent
Poltorak

(10) Patent No.: US 9,228,785 B2
(45) Date of Patent: Jan. 5, 2016

(54) FRACTAL HEAT TRANSFER DEVICE

(76) Inventor: Alexander Poltorak, Monsey, NY (US)

( * ) Notice: Subject to any disclaimer, the term of this patent is extended or adjusted under 35 U.S.C. 154(b) by 639 days.

(21) Appl. No.: 13/106,640

(22) Filed: May 12, 2011

(65) Prior Publication Data

US 2012/0285660 A1 Nov. 15, 2012

Related U.S. Application Data

(60) Provisional application No. 61/331,103, filed on May 4, 2010.

(51) Int. Cl.
F28F 21/02 (2006.01)
F28D 21/00 (2006.01)

(52) U.S. Cl.
CPC ......... *F28F 21/02* (2013.01); *F28D 2021/0029* (2013.01); *F28F 2215/10* (2013.01); *F28F 2255/20* (2013.01)

(58) Field of Classification Search
CPC .......................... F28F 2210/02; F28F 2215/04
USPC ........... 165/80.3, 135, 185, 134.1, 135.5, 133
See application file for complete search history.

(56) References Cited

U.S. PATENT DOCUMENTS

| | | | | |
|---|---|---|---|---|
| 4,715,438 A * | 12/1987 | Gabuzda et al. | | 165/185 |
| 5,870,284 A | 2/1999 | Stewart et al. | | |
| 6,015,008 A * | 1/2000 | Kogure et al. | | 165/185 |
| 6,333,852 B1 * | 12/2001 | Lin | | 361/697 |
| 6,688,381 B2 * | 2/2004 | Pence et al. | | 165/168 |
| 6,736,195 B2 * | 5/2004 | Busch et al. | | 165/109.1 |
| 6,865,083 B2 * | 3/2005 | Liu | | 361/704 |
| 6,937,473 B2 * | 8/2005 | Cheng et al. | | 361/704 |
| 7,195,058 B2 * | 3/2007 | Wolford et al. | | 165/104.21 |
| 7,256,751 B2 | 8/2007 | Cohen | | |
| 7,351,360 B2 | 4/2008 | Hougham et al. | | |
| 7,411,791 B2 * | 8/2008 | Chang et al. | | 361/703 |
| 7,646,607 B2 * | 1/2010 | Gallina et al. | | 361/710 |
| 8,014,150 B2 * | 9/2011 | Campbell et al. | | 361/700 |
| 8,030,818 B2 * | 10/2011 | Nelson et al. | | 310/208 |
| 8,037,927 B2 * | 10/2011 | Schuette | | 165/104.26 |
| 8,295,046 B2 * | 10/2012 | St. Rock et al. | | 361/697 |
| 2003/0183368 A1 * | 10/2003 | Paradis et al. | | 165/80.3 |
| 2005/0116336 A1 * | 6/2005 | Chopra et al. | | 257/720 |

(Continued)

OTHER PUBLICATIONS

Wang et al., Flow and Thermal Characteristics of Offset Branching Network, Aug. 12, 2009, International Journal of Thermal Science, vol. 49, pp. 272-280 (PDF attachment).*

(Continued)

*Primary Examiner* — Steve M Gravini
*Assistant Examiner* — John Higgins
(74) *Attorney, Agent, or Firm* — Steven M. Hoffberg; Ostrolenk Faber LLP

(57) ABSTRACT

A heatsink comprising a heat exchange device having a plurality of heat exchange elements each having a surface boundary with respect to a heat transfer fluid, having a fractal variation therebetween, wherein the heat transfer fluid is induced to flow with respect to the plurality of fractally varying heat exchange elements such that flow-induced vortices are generated at non-corresponding locations of the plurality of fractally varying heat exchange elements, resulting in a reduced resonance as compared to a corresponding heat exchange device having a plurality of heat exchange elements that produce flow-induced vortices at corresponding locations on the plurality of heat exchange elements.

32 Claims, 3 Drawing Sheets

(56) References Cited

U.S. PATENT DOCUMENTS

| | | |
|---|---|---|
| 2006/0037177 A1 | 2/2006 | Blum |
| 2006/0237178 A1* | 10/2006 | Katoh et al. ............... 165/153 |
| 2007/0230135 A1* | 10/2007 | Feger et al. ............... 361/717 |
| 2008/0080137 A1* | 4/2008 | Otsuki et al. ............... 361/697 |
| 2008/0149304 A1* | 6/2008 | Slaughter ............... 165/80.2 |
| 2009/0050293 A1* | 2/2009 | Kuo ............... 165/80.3 |
| 2009/0071624 A1* | 3/2009 | Zhang et al. ............... 165/80.3 |
| 2009/0321045 A1 | 12/2009 | Hernon et al. |
| 2010/0085713 A1* | 4/2010 | Balandin et al. ............... 361/705 |

OTHER PUBLICATIONS

Search Report PCT/IB11/01026 dated May 13, 2011.

Liu et al, Heat Transfer and Pressure Drop in Fractal Microchannel Heat Sink for Cooling of Electronic Chips, 44 Heat Mass Transfer 221 (2007).

Boming Yu et al, Fractal-Like Tree Networks Reducing the Thermal Conductivity, 2006 The American Physical Society.

Yong-Jiun Lee et al, Enhanced Microchannel Heat Sinks Using Oblique Fins, IPack 2009-89059, San Francisco, CA, 2009.

J. Hone, Carbon Nanotubes: Thermal Properties, New York, NY 2004.

Chen Yongping et al, Characteristics of Heat and Fluid Flow in Fractal Tree-Like Channel Heat Sink, 2009.

Balasubramania, K. et al, Pressure Drop Characteristics and Instabilities During Flow Boiling in Parallel and Oblique Finned Microchannels—A Comparative Study, 2012.

Wikipedia article Heat Sink.org/wiki/Heat~sink.

Nicole Delong Okamoto, Unknown, "Heat sink selection", Mechanical engineering department, San Jose State University [Jan. 27, 2010]. www.engr.sjsu.edu/ndejong/ME%20146%20files/Heat%20Sink.ppt.

F. Bonetto et al, Fourier Law, Atlanta, GA 20006.

Jie Li et al, Computational Analysis of Nanofluid Flow in Microchannels with Applications to Micro-Heat Sinks and Bio-MEMS, Raleigh, North Carolina 2008.

Ake Malhammar, A Method for Comparing Heat Sinks Based on Reynolds Analogy, France, Sep. 29-Oct. 2004. ludens.cl/Electron/Thermal.html.

Wang Xiangqi, New Approaches to Micro-Electronic Component Cooling, National University of Singapore, 2007.

Lance Covert et al, 5.8 GHz Orientation-Specific Extruded-fin Heatsink Antennas for 3D RF System Integration, 2008.

F. J. Hong et al, Conjugate Heat Transfer in Fractal-Shaped Microchannel Network Heat Sink for Integrated Microelecronic Cooling Application, 2007.

Ali Y. Alharbi et al, Thermal Characteristics of Microscale Fractal-Like Branching Channels, J. Heat Transfer, vol. 126, Issue 5, Oct. 2004.

S. M. Senn et al, Laminar Mixing, Heat Transfer and Pressure Drop, Zurich, Switzerland, 2003.

W. Escher et al, Efficiency of Optimized Bifurcating Tree-Like and Parallel Microchannel Networks in the Cooling of Electronics, Switzerland 2008.

Azar, A, et al., 2009, "Heat sink testing methods and common oversights", Qpedia Thermal E-Magazine, Jan. 2009.

Frigus Primore, "Natural Convection and Inclined Parallel Plates," www.frigprim.com/articels2/parallel_pl_Inc.html.

Frigus Primore, "Natural Convection and Chimneys," available at www.frigprim.com/articels2/parallel_plchim.html.

Paul Battern, "Sub-Grid Turbulence Modeling for Unsteady Flow with Acoustic Resonance," available at www.metacomptech.com/cfd++/00-0473.pdf.

NJ Ryan, DA Stone, "Application of the FD-TD method to modelling the electromagnetic radiation from heatsinks", IEEE International Conference on Electromagnetic Compatibility, 1997. 10th (Sep. 1-3, 1997), pp. 119-124.

Mandelbrot, B.B. (1982), The Fractal Geometry of Nature. W.H. Freeman and Company. ISBN 0-7167-1186-9. (1982).

Wikipedia article en.wikipedia.org/wiki/Fractal.

Boris Yakobson, "Acoustic waves may cool microelectronics", Nano Letters, ACS (2010).

Wikipedia article en.wikipedia.org/wiki/Phonon.

web.mit.edu/press/2010/thermopower-waves.html.

* cited by examiner

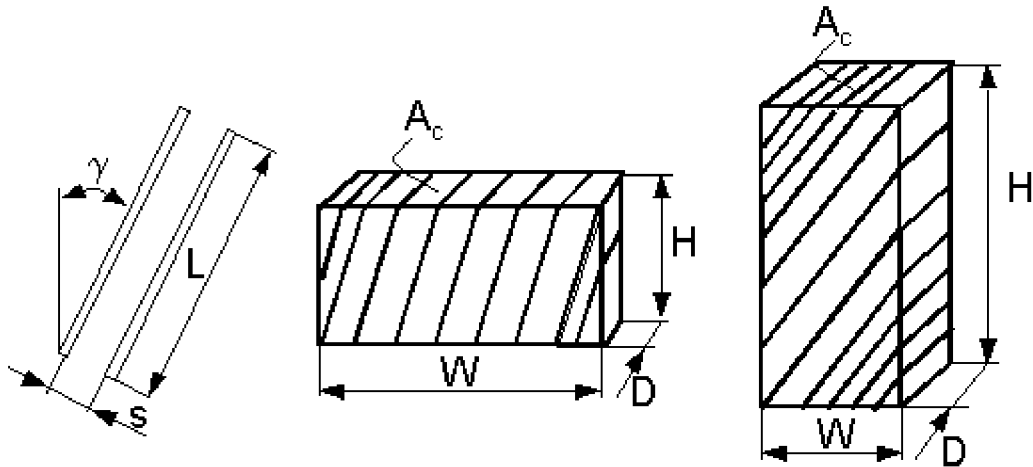

Optimum plate spacing

(1) $S_{opt} = k_s \cdot \left(\dfrac{L}{dT}\right)^{0.25} \cdot \cos(\gamma)^{-0.25}$ $\gamma_{opt} = \operatorname{atan}\left(\dfrac{1}{3} \cdot \dfrac{H}{W}\right) \qquad \dfrac{H}{W} < \sqrt{3}$ $\gamma_{opt} = \dfrac{\pi}{4} - 0.508 \cdot \left(\dfrac{H}{W}\right)^{-1.237} \qquad \dfrac{H}{W} > \sqrt{3}$

Total heat dissiaption

(2) $\dot{Q} = k_v \cdot k_\gamma \cdot A_c \cdot H^{0.5} \cdot dT^{1.5}$ $k_\gamma = \sqrt{1 + \dfrac{1}{9} \cdot \left(\dfrac{H}{W}\right)^2} \qquad \dfrac{H}{W} < \sqrt{3}$ $k_\gamma = 0.307 \cdot \left(\dfrac{H}{W}\right)^{-0.5} + 0.696 \cdot \left(\dfrac{H}{W}\right)^{0.5} \qquad \dfrac{H}{W} > \sqrt{3}$

Applied equation

(3) $\dot{Q} = \eta_v \cdot k_v \cdot k_\gamma \cdot A_c \cdot H^{0.5} \cdot dT_{ref}^{1.5}$

----------------------

$dT$ = Temperature difference [K]

$A_c = W \cdot D$ $\eta_v$ = Volumetric efficiency [--]

$\dot{Q}$ = Heat dissipation [W]

Fig. 1

FRACTAL HEAT TRANSFER DEVICE

CROSS-REFERENCE TO RELATED PROVISIONAL APPLICATION

This application claims priority benefit of provisional U.S. Patent Application Ser. No. 61/331,103, entitled FRACTAL HEAT TRANSFER DEVICE, filed on May 4, 2010, which application is hereby incorporated by reference in its entirety, including all Figures, Tables, and Claims.

FIELD OF THE INVENTION

This invention relates to the field of heatsinks or items that transfer heat between a concentrated source or sink and a fluid.

BACKGROUND OF THE INVENTION

A heat sink is a term for a component or assembly that transfers heat generated within a solid material to a fluid medium, such as air or a liquid. A heat sink is typically physically designed to increase the surface area in contact with the cooling fluid surrounding it, such as the air. Approach air velocity, choice of material, fin (or other protrusion) design and surface treatment are some of the design factors which influence the thermal resistance, i.e. thermal performance, of a heat sink.

A heat sink transfers thermal energy from a higher temperature to a lower temperature fluid medium. The fluid medium is frequently air, but can also be water or in the case of heat exchangers, refrigerants and oil. Fourier's law of heat conduction, simplified to a one-dimensional form in the x-direction, shows that when there is a temperature gradient in a body, heat will be transferred from the higher temperature region to the lower temperature region. The rate at which heat is transferred by conduction, $q_k$, is proportional to the product of the temperature gradient and the cross-sectional area through which heat is transferred:

$$q_k = -kA\frac{dT}{dx} \quad (1)$$

where $q_k$ is the rate of conduction, k is a constant which depends on the materials that are involved, A is the surface area through which the heat must pass, and dT/dx is the rate of change of temperature with respect to distance (for simplicity, the equation is written in one dimension). Thus, according to Fourier's law (which is not the only consideration by any means), heatsinks benefit from having a large surface area exposed to the medium into which the heat is to be transferred.

Consider a heat sink in a duct, where air flows through the duct, and the heat sink base is higher in temperature than the air. Assuming conservation of energy, for steady-state conditions, and applying Newton's law of cooling, gives the following set of equations.

$$\dot{Q} = \dot{m}c_{p,in}(T_{air,out} - T_{air,in}) \quad (2)$$

$$\dot{Q} = \frac{T_{hs} - T_{air,av}}{R_{hs}} \text{ where} \quad (3)$$

$$T_{air,av} = \frac{T_{air,put} + T_{air,in}}{2} \quad (4)$$

Using the mean air temperature is an assumption that is valid for relatively short heat sinks. When compact heat exchangers are calculated, the logarithmic mean air temperature is used. $\dot{m}$ is the air mass flow rate in kg/s.

The above equations show that when the air flow through the heat sink decreases, this results in an increase in the average air temperature. This in turn increases the heat sink base temperature. And additionally, the thermal resistance of the heat sink will also increase. The net result is a higher heat sink base temperature. The inlet air temperature relates strongly with the heat sink base temperature. Therefore, if there is no air or fluid flow around the heat sink, the energy dissipated to the air cannot be transferred to the ambient air. Therefore, the heat sink functions poorly.

Other examples of situations in which a heat sink has impaired efficiency: Pin fins have a lot of surface area, but the pins are so close together that air has a hard time flowing through them; Aligning a heat sink so that the fins are not in the direction of flow; Aligning the fins horizontally for a natural convection heat sink. Whilst a heat sink is stationary and there are no centrifugal forces and artificial gravity, air that is warmer than the ambient temperature always flows upward, given essentially-still-air surroundings; this is convective cooling.

The most common heat sink material is aluminum. Chemically pure aluminum is not used in the manufacture of heat sinks, but rather aluminum alloys. Aluminum alloy 1050A has one of the higher thermal conductivity values at 229 W/m·K. However, it is not recommended for machining, since it is a relatively soft material. Aluminum alloys 6061 and 6063 are the more commonly used aluminum alloys, with thermal conductivity values of 166 and 201 W/m·K, respectively. The aforementioned values are dependent on the temper of the alloy.

Copper is also used since it has around twice the conductivity of aluminum, but is three times as heavy as aluminum. Copper is also around four to six times more expensive than aluminum, but this is market dependent. Aluminum has the added advantage that it is able to be extruded, while copper cannot. Copper heat sinks are machined and skived. Another method of manufacture is to solder the fins into the heat sink base.

Another heat sink material that can be used is diamond. With a value of 2000 W/mK it exceeds that of copper by a factor of five. In contrast to metals, where heat is conducted by delocalized electrons, lattice vibrations are responsible for diamond's very high thermal conductivity. For thermal management applications, the outstanding thermal conductivity and diffusivity of diamond is an essential. CVD diamond may be used as a sub-mount for high-power integrated circuits and laser diodes.

Composite materials can be used. Examples are a copper-tungsten pseudoalloy, AlSiC (silicon carbide in aluminum matrix), Dymalloy (diamond in copper-silver alloy matrix), and E-Material (beryllium oxide in beryllium matrix). Such materials are often used as substrates for chips, as their thermal expansion coefficient can be matched to ceramics and semiconductors.

Fin efficiency is one of the parameters which makes a higher thermal conductivity material important. A fin of a heat sink may be considered to be a flat plate with heat flowing in one end and being dissipated into the surrounding fluid as it travels to the other. As heat flows through the fin, the combination of the thermal resistance of the heat sink impeding the flow and the heat lost due to convection, the temperature of the fin and, therefore, the heat transfer to the fluid, will decrease from the base to the end of the fin. This factor is called the fin efficiency and is defined as the actual heat transferred by the fin, divided by the heat transfer were the fin to be isothermal (hypothetically the fin having infinite thermal conductivity). Equations 5 and 6 are applicable for straight fins.

$$\eta_f = \frac{\tanh(mL_c)}{mL_c} \quad (5)$$

$$mL_c = \sqrt{\frac{2h_f}{kt_f}} L_f \quad (6)$$

Where:
$h_f$ is the convection coefficient of the fin
Air: 10 to 100 W/(m²K)
Water: 500 to 10,000 W/(m²K)
k is the thermal conductivity of the fin material
Aluminum: 120 to 240 W/(m·K)
$L_f$ is the fin height (m)
$t_f$ is the fin thickness (m)

Another parameter that concerns the thermal conductivity of the heat sink material is spreading resistance. Spreading resistance occurs when thermal energy is transferred from a small area to a larger area in a substance with finite thermal conductivity. In a heat sink, this means that heat does not distribute uniformly through the heat sink base. The spreading resistance phenomenon is shown by how the heat travels from the heat source location and causes a large temperature gradient between the heat source and the edges of the heat sink. This means that some fins are at a lower temperature than if the heat source were uniform across the base of the heat sink. This non-uniformity increases the heat sink's effective thermal resistance.

A pin fin heat sink is a heat sink that has pins that extend from its base. The pins can be, for example, cylindrical, elliptical or square. A second type of heat sink fin arrangement is the straight fin. These run the entire length of the heat sink. A variation on the straight fin heat sink is a cross cut heat sink. A straight fin heat sink is cut at regular intervals but at a coarser pitch than a pin fin type.

In general, the more surface area a heat sink has, the better it works. However, this is not always true. The concept of a pin fin heat sink is to try to pack as much surface area into a given volume as possible. As well, it works well in any orientation. Kordyban has compared the performance of a pin fin and a straight fin heat sink of similar dimensions. Although the pin fin has 194 cm² surface area while the straight fin has 58 cm², the temperature difference between the heat sink base and the ambient air for the pin fin is 50° C. For the straight fin it was 44° C. or 6° C. better than the pin fin. Pin fin heat sink performance is significantly better than straight fins when used in their intended application where the fluid flows axially along the pins rather than only tangentially across the pins.

Another configuration is the flared fin heat sink; its fins are not parallel to each other, but rather diverge with increasing distance from the base. Flaring the fins decreases flow resistance and makes more air go through the heat sink fin channel; otherwise, more air would bypass the fins. Slanting them keeps the overall dimensions the same, but offers longer fins.

Forghan, et al. have published data on tests conducted on pin fin, straight fin and flared fin heat sinks. They found that for low approach air velocity, typically around 1 m/s, the thermal performance is at least 20% better than straight fin heat sinks. Lasance and Eggink also found that for the bypass configurations that they tested, the flared heat sink performed better than the other heat sinks tested.

The heat transfer from the heatsink is mediated by two effects: conduction via the coolant, and thermal radiation. The surface of the heatsink influences its emissivity; shiny metal absorbs and radiates only a small amount of heat, while matte black radiates highly. In coolant-mediated heat transfer, the contribution of radiation is generally small. A layer of coating on the heatsink can then be counterproductive, as its thermal resistance can impair heat flow from the fins to the coolant. Finned heatsinks with convective or forced flow will not benefit significantly from being colored. In situations with significant contribution of radiative cooling, e.g. in case of a flat non-finned panel acting a's a heatsink with low airflow, the heatsink surface finish can play an important role. Matte-black surfaces will radiate much more efficiently than shiny bare metal. The importance of radiative vs. coolant-mediated heat transfer increases in situations with low ambient air pressure (e.g. high-altitude operations) or in vacuum (e.g. satellites in space).

Fourier, J. B., 1822, Theorie analytique de la chaleur, Paris; Freeman, A., 1955, translation, Dover Publications, Inc, NY.

Kordyban, T., 1998, Hot air rises and heat sinks—Everything you know about cooling electronics is wrong, ASME Press, NY.

Anon, Unknown, "Heat sink selection", Mechanical engineering department, San Jose State University [27 Jan. 2010]. www.engr.sjsu.edu/ndejong/ME%20146%20files/Heat%20Sink.pptwww.engr.sjsu.edu/ndejong/ME%20146%20files/Heat%20Sink.ppt Sergent, J. and Krum, A., 1998, Thermal management handbook for electronic assemblies, First Edition, McGraw-Hill.

Incropera, F. P. and DeWitt, D. P., 1985, Introduction to heat transfer, John Wiley and sons, NY.

Forghan, F., Goldthwaite, D., Ulinski, M., Metghalchi, M., 2001, Experimental and Theoretical Investigation of Thermal Performance of Heat Sinks, ISME May.

Lasance, C. J. M and Eggink, H. J., 2001, A Method to Rank Heat Sinks in Practice: The Heat Sink Performance Tester, 21st IEEE SEMI-THERM Symposium.

ludens.cl/Electron/Thermal.html

Lienard, J. H., IV & V, 2004, A Heat Transfer Textbook, Third edition, MIT

Saint-Gobain, 2004, "Thermal management solutions for electronic equipment" 22 Jul. 2008 www.fff.saint-gobain.com/Media/Documents/S0000000000000001036/ThermaCool%20Brochure.pdf Jeggels, Y. U., Dobson, R. T., Jeggels, D. H., Comparison of the cooling performance between heat pipe and aluminium conductors for electronic equipment enclosures, Proceedings of the 14th International Heat Pipe Conference, Florianopolis, Brazil, 2007.

Prstic, S., Iyengar, M., and Bar-Cohen, A., 2000, Bypass effect in high performance heat sinks, Proceedings of the International Thermal Science Seminar Bled, Slovenia, June 11-14.

Mills, A. F., 1999, Heat transfer, Second edition, Prentice Hall.

Potter, C. M. and Wiggert, D. C., 2002, Mechanics of fluid, Third Edition, Brooks/Cole.

White, F. M., 1999, Fluid mechanics, Fourth edition, McGraw-Hill International.

Azar, A, et al., 2009, "Heat sink testing methods and common oversights", Qpedia Thermal E-Magazine, January 2009 Issue. www.qats.com/cpanel/UploadedPdf/January20092.pdf Several structurally complex heatsink designs are discussed in Hernon, US App. 2009/0321045, incorporated herein by reference.

Heatsinks operate by removing heat from an object to be cooled into the surrounding air, gas or liquid through convection and radiation. Convection occurs when heat is either carried passively from one point to another by fluid motion (forced convection) or when heat itself causes fluid motion (free convection). When forced convection and free convection occur together, the process is termed mixed convection. Radiation occurs when energy, for example in the form of heat, travels through a medium or through space and is ultimately absorbed by another body. Thermal radiation is the process by which the surface of an object radiates its thermal energy in the form of electromagnetic waves. Infrared radiation from a common household radiator or electric heater is an example of thermal radiation, as is the heat and light (IR and visible EM waves) emitted by a glowing incandescent light bulb. Thermal radiation is generated when heat from the movement of charged particles within atoms is converted to electromagnetic radiation.

A heatsink tends to decrease the maximum temperature of the exposed surface, because the power is transferred to a larger volume. This leads to a possibility of diminishing return on larger heatsinks, since the radiative and convective dissipation tends to be related to the temperature differential between the heatsink surface and the external medium. Therefore, if the heatsink is oversized, the efficiency of heat shedding is poor. If the heatsink is undersized, the object may be insufficiently cooled, the surface of the heatsink dangerously hot, and the heat shedding not much greater than the object itself absent the heatsink.

The relationship between friction and convention in heatsinks is discussed by Frigus Primore in "A Method for Comparing Heat Sinks Based on Reynolds Analogy," available at www.frigprim.com/downloads/Reynolds_analogy_heatsinks.PDF, last accessed Apr. 28, 2010. This article notes that for, plates, parallel plates, and cylinders to be cooled, it is necessary for the velocity of the surrounding fluid to be low in order to minimize mechanical power losses. However, larger surface flow velocities will increase the heat transfer efficiency, especially where the flow near the surface is turbulent, and substantially disrupts a stagnant surface boundary layer. Primore also discusses heatsink fin shapes and notes that no fin shape offers any heat dissipation or weight advantage compared with planar fins, and that straight fins minimize pressure losses while maximizing heat flow. Therefore, the art generally teaches that generally flat and planar surfaces are appropriate for most heatsinks.

Frigus Primore, "Natural Convection and Inclined Parallel Plates," www.frigprim.com/articels2/parallel_pl_Inc.html, last accessed Apr. 29, 2010, discusses the use of natural convection (i.e., convection due to the thermal expansion of a gas surrounding a solid heatsink in normal operating conditions) to cool electronics. One of the design goals of various heatsinks is to increase the rate of natural convection. Primore suggests using parallel plates to attain this result. Once again, Primore notes that parallel plate heat sinks are the most efficient and attempts to define the optimal spacing and angle (relative to the direction of the fluid flow) of the heat sinks according to the equations in FIG. 1.

In another article titled "Natural Convection and Chimneys," available at www.frigprim.com/articels2/parallel_plchim.html, last accessed Apr. 29, 2010, Frigus Primore discusses the use of parallel plates in chimney heat sinks. One purpose of this type of design is to combine more efficient natural convection with a chimney. Primore notes that the design suffers if there is laminar flow (which creates a re-circulation region in the fluid outlet, thereby completely eliminating the benefit of the chimney) but benefits if there is turbulent flow which allows heat to travel from the parallel plates into the chimney and surrounding fluid.

In "Sub-Grid Turbulence Modeling for Unsteady Flow with Acoustic Resonance," available at www.metacomptech.com/cfd++/00-0473.pdf, last accessed Apr. 29, 2010, incorporated herein by reference, Paul Batten et al discuss that when a fluid is flowing around an obstacle, localized geometric features, such as concave regions or cavities, create pockets of separated flow which can generate self-sustaining oscillations and acoustic resonance. The concave regions or cavities serve to substantially reduce narrow band acoustic resonance as compared to flat surfaces. This is beneficial to a heat sink in a turbulent flow environment because it allows for the reduction of oscillations and acoustic resonance, and therefore for an increase in the energy available for heat transfer.

In S. Liu, "Heat Transfer and Pressure Drop in Fractal Microchannel Heat Sink for Cooling of Electronic Chips," 44 Heat Mass Transfer 221 (2007), Liu et al discuss a heatsink with a "fractal-like branching flow network." Liu's heatsink includes channels through which fluids would flow in order to exchange heat with the heatsink.

Y. J. Lee, "Enhanced Microchannel Heat Sinks Using Oblique Fins," IPACK 2009-89059, similarly discusses a heat sink comprising a "fractal-shaped microchannel based on the fractal pattern of mammalian circulatory and respiratory system." Lee's idea, similar to that of Liu, is that there would be channels inside the heatsink through which a fluid could flow to exchange heat with the heatsink. The stated improvement in Lee's heatsink is (1) the disruption of the thermal boundary layer development; and (2) the generation of secondary flows.

Pence, D. V., 2002, "Reduced Pumping Power and Wall Temperature in Microchannel Heat Sinks with Fractal-like Branching Channel Networks", Microscale Thermophys. Eng. 5, pp. 293-311, similarly, mentions heatsinks that have fractal-like channels allowing fluid to enter into the heat sink. The described advantage of Pence's structure is increased exposure of the heat sink to the fluid and lower pressure drops of the fluid while in the heatsink.

In general, a properly designed heatsink system will take advantage of thermally induced convection or forced air (e.g., a fan). In general, a turbulent flow near the surface of the heatsink disturbs a stagnant surface layer, and improves performance. In many cases, the heatsink operates in a non-ideal environment subject to dust or oil; therefore, the heatsink design must accommodate the typical operating conditions, in addition to the as-manufactured state.

Prior art heatsink designs have traditionally concentrated on geometry that is Euclidian, involving structures such as the pin fins, straight fins, and flares discussed above.

N J Ryan, D A Stone, "Application of the FD-TD method to modelling the electromagnetic radiation from heatsinks", IEEE International Conference on Electromagnetic Compatibility, 1997. 10th (1-3 Sep. 1997), pp: 119-124, discloses a fractal antenna which also serves as a heatsink in a radio frequency transmitter.

Lance Covert, Jenshan Lin, Dan Janning, Thomas Dalrymple, "5.8 GHz orientation-specific extruded-fin heatsink antennas for 3D RF system integration", 23 APR 2008 DOI: 10.1002/mop.23478, Microwave and Optical Technology Letters Volume 50, Issue 7, pages 1826-1831, July 2008 also provide a heatsink which can be used as an antenna.

SUMMARY OF THE INVENTION

Most heatsinks are designed using a linear or exponential relationship of the heat transfer and dissipating elements. A known geometry which has not generally been employed is fractal geometry. Some fractals are random fractals, which are also termed chaotic or Brownian fractals and include random noise components. In deterministic fractal geometry, a self-similar structure results from the repetition of a design or motif (or "generator") using a recursive algorithm, on a series of different size scales. As a result, certain types of fractal images or structures appear to have self-similarity over a broad range of scales. On the other hand, no two ranges within the design are identical.

A fractal is defined as "a rough or fragmented geometric shape that can be split into parts, each of which is (at least approximately) a reduced-size copy of the whole." Mandelbrot, B. B. (1982). That is, there is a recursive algorithm which describes the structure. The Fractal Geometry of Nature. W.H. Freeman and Company. ISBN 0-7167-1186-9. This property is termed "self-similarity." For a more detailed discussion of fractals, see the Wikipedia article thereon at en.wikipedia.org/wiki/Fractal (last accessed Apr. 14, 2010) incorporated herein by reference. Exemplary images of well-known fractal designs can also be viewed on the Wikipedia page. Due to the fact that fractals involve largely self-repeating patterns, each of which serves to increase the surface area in three-dimensional fractals (perimeter in two-dimensional fractals), three dimensional fractals in theory are characterized by infinite surface area (and two-dimensional fractals are characterized by infinite perimeter). In practical implementations, the scale of the smallest features which remain true to the generating algorithm may be 3-25 iterations of the algorithm. Less than three recursions, and the fractal nature is not apparent, while present manufacturing technologies limit the manufacture of objects with a large range of feature scales.

This fractal nature is useful in a heatsink because the rate at which heat is transferred from a surface, either through convection or through radiation, is typically related to, and increasing with, the surface area. Of course, due to limitations in the technology used to build these heatsinks, engineering compromise is expected. However a feature of an embodiment of the designs proposed herein is that vortices induced by fluid flow over a heat transfer surface will be chaotically distributed over various elements of the surface, thus disrupting the stagnant surface boundary layer and increasing the effective surface area available for heat transfer, while avoiding acoustic resonance which may be apparent from a regular array of structures which produce vortices and turbulence.

Further, a large physical surface area to volume ratio, which is generally useful in heatsink design, can still be obtained using the fractal model. In addition, fractal structures provide a plurality of concave regions or cavities, providing pockets of separated flow which can generate self-sustaining oscillations and acoustic resonance. These pockets serve to reduce the acoustic resonance in turbulent flowing fluid (as compared to flat or Euclidian surfaces), thus allowing for more effective heat transfer between the fractal structure and the surrounding fluid, thereby making the fractal structure ideal for a heatsink.

U.S. Pat. No. 7,256,751, issued to Cohen, incorporated herein by reference, discusses fractal antennas. In the background of this patent, Cohen discusses Kraus' research, noting that Euclidian antennas with low area (and therefore low perimeter) exhibit very low radiation resistance and are thus inefficient. Cohen notes that the advantages of fractal antennas, over traditional antennas with Euclidian geometries, is that they can maintain the small area, while having a larger perimeter, allowing for a higher radiation resistance. Also, Cohen's fractal antenna features non-harmonic resonance frequencies, good bandwidth, high efficiency, and an acceptable standing wave ratio.

In the instant invention, this same wave theory may be applied to fractal heatsinks, especially with respect to the interaction of the heat transfer fluid with the heatsink. Thus, while the heat conduction within a solid heatsink is typically not modeled as a wave (though modern thought applies phonon phenomena to graphene heat transport), the fluid surrounding the heating certainly is subject to wave phenomena, complex impedances, and indeed the chaotic nature of fluid eddies may interact with the chaotic surface configuration of the heatsink.

The efficiency of capturing electric waves in a fractal antenna, achieved by Cohen, in some cases can be translated into an efficiency transferring heat out of an object to be cooled in a fractal heatsink as described herein. See, Boris Yakobson, "Acoustic waves may cool microelectronics", Nano Letters, ACS (2010). Some physics scholars have suggested that heat can be modeled as a set of phonons. Convection and thermal radiation can therefore be modeled as the movement of phonons. A phonon is a quasiparticle characterized by the quantization of the modes of lattice vibration of solid crystal structures. Any vibration by a single phonon is in the normal mode of classical mechanics, meaning that the lattice oscillates in the same frequency. Any other arbitrary lattice vibration can be considered a superposition of these elementary vibrations. Under the phonon model, heat travels in waves, with a wavelength on the order of 1 μm. In most materials, the phonons are incoherent, and therefore a macroscopic scales, the wave nature of heat transport is not apparent or exploitable.

The thermodynamic properties of a solid are directly related to its phonon structure. The entire set of all possible phonons combine in what is known as the phonon density of states which determines the heat capacity of a crystal. At absolute zero temperature (0 Kelvin or −273 Celsius), a crystal lattice lies in its ground state, and contains no phonons. A lattice at a non-zero temperature has an energy that is not constant, but fluctuates randomly about some mean value. These energy fluctuations are caused by random lattice vibrations, which can be viewed as a gas-like structure of phonons or thermal phonons. However, unlike the atoms which make up an ordinary gas, thermal phonons can be created and destroyed by random energy fluctuations. In the language of statistical mechanics this means that the chemical potential for adding a phonon is zero. For a more detailed description of phonon theory, see the Wikipedia article thereon available at en.wikipedia.org/wiki/Phonon (last accessed Apr. 16, 2010) incorporated herein by reference.

In certain materials, such as graphene, phonon transport phenomena are apparent at macroscopic levels, which make phonon impedance measurable and useful. Thus, if a graphene sheet were formed to resonate at a particular phonon wavelength, the resonant energy would not be emitted. On the other hand, if the graphene sheet were configured using a fractal geometry, the phonon impedance would be well controlled over a broad range of wavelengths, with sharp resonances at none, leading to an efficient energy dissipation device.

Many fractal designs are characterized by concave regions or cavities. See, for example, FIGS. 2 and 3. While sets of concavities may be useful in improving aerodynamics and fluid dynamics to increase turbulence, if they are disposed in a regular array, they will likely produce an acoustic resonance, and may have peaks in a fluid impedance function. On the other hand, the multiscale nature of a fractal geometric design will allow the system to benefit from the concavities, while avoiding a narrowly tuned system.

The present system proposes a fractal-shaped heatsink for the purpose of dissipating heat. The benefits of a fractal heatsink, over a traditional heatsink having a Euclidian geometry may include: (1) the fractal heatsink has a greater surface area, allowing for more exposure of the hot device to the surrounding air or liquid and faster dissipation of heat; and (2) due to the plethora of concave structures or cavities in fractal structures, the fractal heatsink is better able to take advantage of flow mechanics than a traditional heatsink, resulting in heat entering and exiting the heatsink more quickly (3) acoustic properties, especially in forced convection systems.

The invention provides a heatsink to cool an object through convection or radiation. For the smallest heatsink elements, on the order of 10-100 nm, the focus of the heat transfer will be on radiation rather than convection. Electron emission and ionization may also be relevant. Larger heatsink elements, approximately >1 mm in size, will generally rely on convection as the primary form of heat transfer.

In one embodiment, the heatsink comprises a heat exchange device with a plurality of heat exchange elements having a fractal variation therebetween. A heat transfer fluid, such as air, water, or another gas or liquid, is induced to flow through the heat exchange device. The heat transfer fluid has turbulent portions. The fractal variation in the plurality of heat exchange elements substantially reduces the narrow band acoustic resonance as compared to a heatsink having a linear or Euclidian geometric variation between the plurality heat exchange elements. The turbulent flow also disturbs the stagnant surface boundary layer, leading to more efficient heat transfer.

When a heat transfer fluid (air, gas or liquid) is induced to flow over a surface, there may be turbulence in the fluid. The fractal shape of the heatsink serves to reduce the energy lost due to the turbulence, while increasing the surface area of the heatsink subject to turbulence, due to the plethora of concave regions, cavities, and pockets. Therefore, the efficiency of heat transfer may be increased as compared to a heat exchange device having a linear or Euclidian geometric variation between several heat exchange elements.

Preferably, the heat exchange device will include a highly conductive substance whose heat conductivity exceeds 850 W/(m*K). Examples of such superconductors include graphene, diamond, and diamond-like coatings. Alternatively, the heat exchange device may include carbon nanotubes.

Various variations on this heatsink will be apparent to skilled persons in the art. For example, the heatsink could include a heat transfer surface that is connected to the heat exchange device and is designed to accept a solid to be cooled. Alternatively, there could be a connector that is designed to connect with a solid to be cooled in at least one point. In another embodiment, there are at least three connectors serving to keep the solid and the heatsink in a fixed position relative to one another. Various connectors will be apparent to persons skilled in the art. For example, the connector could be a point connector, a bus, a wire, a planar connector or a three-dimensional connector. In another embodiment, the heatsink has an aperture or void in the center thereof designed to accept a solid to be cooled.

This heatsink is intended to be used to cool objects, and may be part of a passive or active system. Modern three-dimensional laser and liquid printers can create objects such as the heatsinks described herein with a resolution of features on the order of about 16 µm, making it feasible for those of skilled in the art to use such fabrication technologies to produce objects with a size below 10 cm. Alternatively, larger heatsinks, such as car radiators, can be manufactured in a traditional manner, designed with an architecture of elements having a fractal configuration. For example, a liquid-to-gas heat exchanger (radiator) may be provided in which segments of fluid flow conduit have a fractal relationship over three levels of recursion, i.e., paths with an average of at least two branches. Other fractal design concepts may be applied concurrently, as may be appropriate.

Yet another embodiment of the invention involves a method of cooling a solid by connecting the solid with a heatsink. The heatsink comprises a heat exchange device having a plurality of heat exchange elements having a fractal variation therebetween. A heat transfer fluid having turbulent portions is induced to flow with respect to the plurality of heat exchange elements. The fractal variation in the plurality of heat exchange elements serves to substantially reduce narrow band resonance as compared to a corresponding heat exchange device having a linear or Euclidean geometric variation between a plurality of heat exchange elements.

A preferred embodiment provides a surface of a solid heatsink, e.g., an internal or external surface, having fluid thermodynamical properties adapted to generate an asymmetric pattern of vortices over the surface over a range of fluid flow rates. For example, the range may comprise a range of natural convective fluid flow rates arising from use of the heatsink to cool a heat-emissive object. The range may also comprise a range of flow rates arising from a forced convective flow (e.g., a fan) over the heatsink.

The heatsink may cool an unconstrained or uncontained fluid, generally over an external surface of a heatsink, or a constrained or contained fluid, generally within an internal surface of a heatsink.

BRIEF DESCRIPTION OF THE DRAWINGS

FIG. 1 shows a set of governing equations for a parallel plate heatsink.

DETAILED DESCRIPTION OF THE PREFERRED EMBODIMENTS

Figure 2:
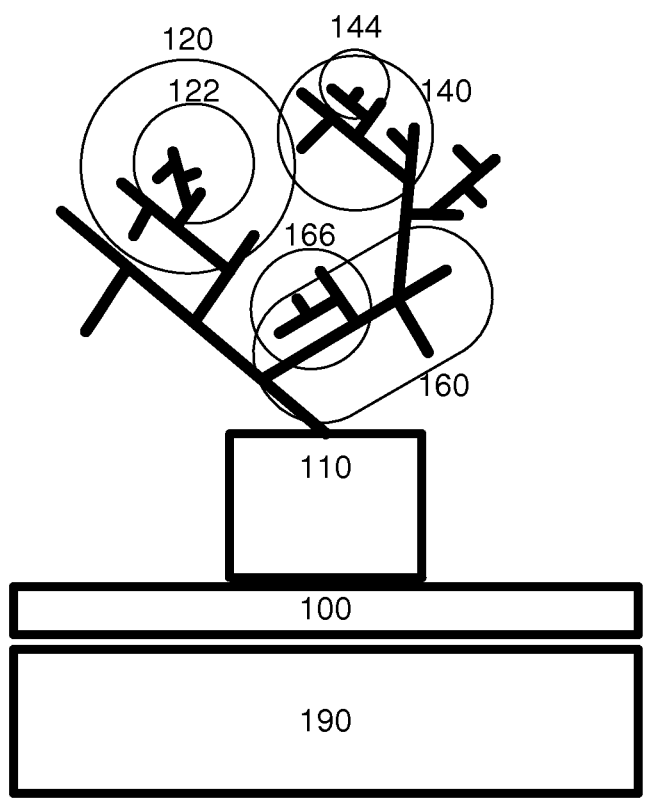
FIG. 2 illustrates a fractal heatsink that is an exemplary embodiment of the invention. In this embodiment, the heatsink is placed adjacent to the object to be cooled.

FIG. 2 illustrates a heatsink implementing an exemplary embodiment of this invention. Note that the illustration is in two dimensions, but a three dimensional embodiment is both possible and preferred. There is a heat transfer surface 100 that allows the heatsink to rest comfortably on a surface, such as the solid to be cooled 190. In the illustrated embodiment, the heat transfer surface 100 is roughly planar, having a closed Euclidian cross-section on the bottom. However, it might also have another shape, for example if the solid to be cooled does not have a planar face. A fractal-shaped heat exchange device begins at point 110. While only one fractal heatsink is illustrated here, skilled persons in the art will recognize other similar fractal heatsinks that are also intended to be covered by the invention. Note that the heatsink has three branches leaving from point 110—branch 120, branch 140, and branch 160. Also note that the branch structure initiating from point 110 is nearly identical to that at point 122 and 142, even though only point 110 is a true starting point. Thus, the fractal property of self-similarity is preserved. We call the structure that begins at point 110 the "first motif," the structure from point 122 the "second motif," and the structure that begins from point 142 the "third motif." Note that, in the embodiment illustrated in FIG. 2, the replication from first to second motif and from second to third motif involves a linear displacement (upward) and a change of scale. In branches not going in the same direction as the prior branch, there is also a rotation. Under the limitations for ideal fractals, the second motif and third motif must be a smaller, exact copy of the first motif. However, due to the limitations imposed by human-made structures and machines, the fractals designed here are generally finite and the second motif will thus be an inexact copy of the first motif, i.e. if there are N levels starting from the first motif, the second motif level will have N−1 levels, if N is very large, the difference is insignificant. In other words, the self-similarity element required in fractals is not preserved perfectly in the preferred designs due to the limitations of available machinery. In addition, the benefits are achieved without requiring fractal relationships over more than a few "orders" of magnitude (iterations of the fractal recursive algorithm). For example, in the embodiment illustrated in FIG. 2, there are no continuing branch divisions and iterations at point 162, even though an ideal fractal would have them. In an ideal fractal, there would be an infinite number of sub-branches from 110, 122, and 142. However, an imperfect fractal shape, as illustrated in FIG. 2, will serve the purposes of this invention.

Persons of ordinary skill in the art will appreciate the advantages offered by the structure 110 in FIG. 2. The fractal heatsink has a much larger surface area than the heat transfer surface alone because all of the "branches" and "leaves" of the fern-like fractal shape serve to increase the surface area. In addition, if a heat transfer fluid is induced to flow above the heat transfer surface 100, the turbulent portions of the heat transfer fluid near the surface will be increased by the textures inherent in the fractal variation in the heat exchange element 110. Because the fractal patterns is itself non-identically repeating within the fractal design, this will serve to substantially reduce narrow band acoustic resonance as compared to a corresponding heat exchange device having a repeating design, e.g., a linear or geometric variation between several heat exchange elements, thereby further aiding in the heat transfer process.

In a preferred embodiment, the heat transfer surface 100 and the roughly fractal-shaped heat exchange element 110 are all made out of an efficient heat conductor, such as copper or aluminum, or more preferably, having a portion whose heat conductivity exceeds 850 W/(m*K), such as graphene with a heat conductivity of between 4840 and 5300 W/(m*K) or diamond with a heat conductivity between 900 and 2320 W/(m*K). This would allow heat to quickly enter the heatsink from the solid and for heat to quickly exit the heatsink through the branches and leaves of the fern-like fractal 110. In another embodiment, the heatsink is formed, at least in part, of carbon nanotubes, which display anisotropic heat conduction, with an efficient heat transfer along the long axis of the tube. Carbon nanotubes are submicroscopic hollow tubes made of a chicken-wire-like or lattice of carbon atoms. These tubes have a diameter of just a few nanometers and are highly heat conductive, transferring heat much faster than diamond, and in some cases comparable to graphene. See web.mit.edu/press/2010/thermopower-waves.html (last accessed Apr. 15, 2010) incorporated herein by reference.

Also note that this exemplary embodiment provides a plethora of openings, e.g. 124 and 126, between the branches or fractal subelements to ensure that all of the branches are exposed to the surrounding air, gas or liquid and to allow the heat to escape from the heatsink into the surroundings. In one embodiment of the invention, at least two of these openings are congruent, as are openings 124 and 126 illustrated here. An embodiment of the invention allows the openings to be filled with the air or liquid from the surrounding medium. Due to the limitation imposed by the solid's flat shape, it is not possible to increase the exposure of the fern-like fractal to the solid. However, the air or liquid outside of the solid are perfect for the fractal's exposure.

Under the phonon model of heat exchange, applicable to carbon nanotubes, graphene materials, and perhaps others, the fractal shape is advantageous to ensure the escape of the phonons into the surrounding fluid medium because the fractal guarantees close to maximal surface exposure to the medium and does not have many parts that are not exposed, as is a problem with many prior art heatsinks. Skilled persons in the art will realize that this could be achieved through many known structures. For example, graphene, which is one-atom-thick carbon and highly heat conductive, would be an advantageous material to use to build the fractal heatsink herein described.

When a turbulently flowing fluid passes around an obstacle, concave regions or cavities in the obstacle create pockets of separated flow which generates self-sustaining oscillations and acoustic resonance. The concave regions or cavities have substantially reduced narrow band acoustic resonance as compared to flat regions on the obstacle. This allows for more energy to be available for heat transfer. Skilled persons in the art will note that fractal structure 110, as many other fractal structures, has a plurality of concave regions to allow for an implementation of this effect.

Figure 3:
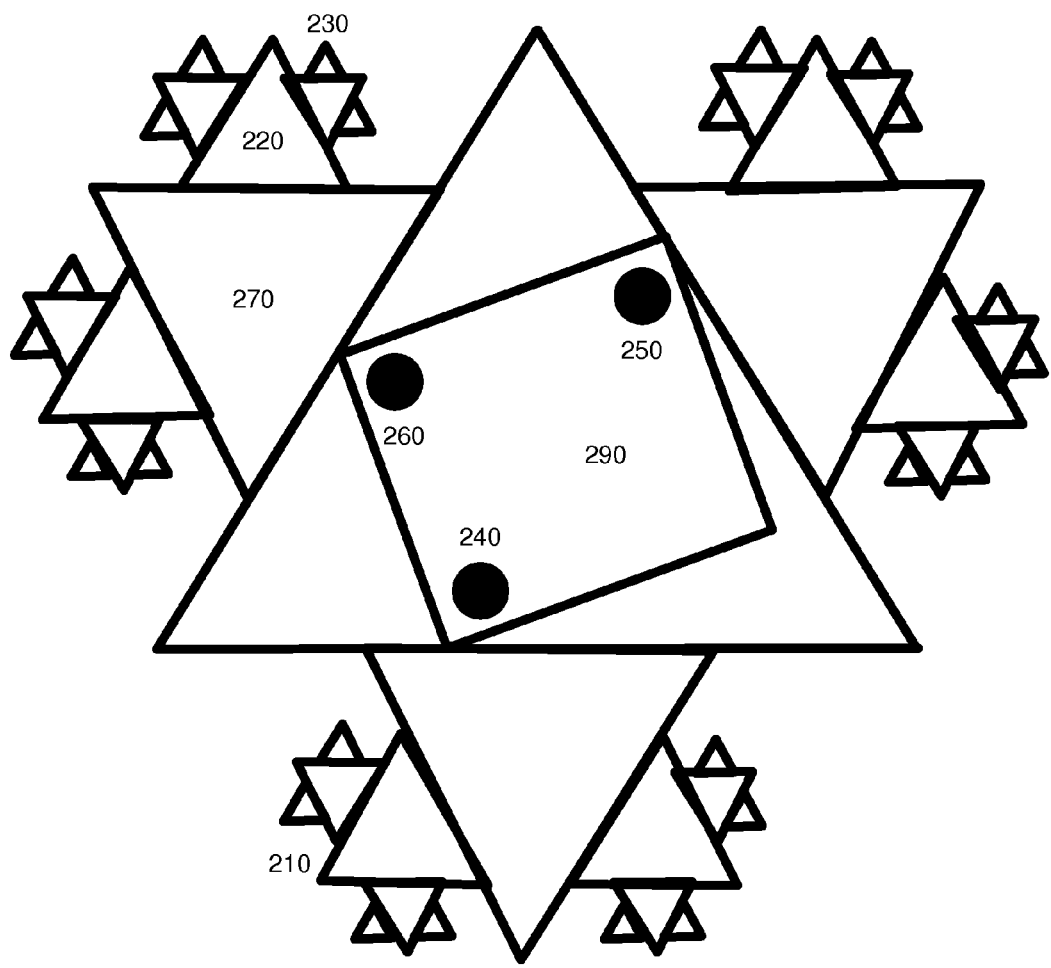
FIG. 3 illustrates a fractal heatsink that is an exemplary embodiment of the invention. In this embodiment, the heatsink is placed either adjacent to or surrounding the object to be cooled.

FIG. 3 illustrates another embodiment of the invention. A solid to be cooled that has an arbitrary shape 290 is located inside (illustrated) or outside (not illustrated) a two-dimensional or three-dimensional roughly fractal shaped 210 heatsink. In one embodiment, the heatsink 210 has an aperture 270 designed to hold the solid. Alternatively, the solid to be cooled might be located outside of the heatsink (not illustrated). Note that, as in FIG. 2, the fractal heat exchange element has multiple motifs, starting with the large triangle at 210, to progressively smaller triangles at 220 and 230. However, note that the fractal does not keep extending infinitely and there are no triangles smaller than the one at 230. In other words, the fractal heatsink 210 has multiple recursive fractal iterations 220 and 230, but the fractal iterations stop at level 230 for simplicity of design and manufacturability. Also note that the fractal submotifs 220 and 230 are of different dimensional sizes from the original fractal motif 210 and protrude from the original fractal shape 210. Here, the first motif is a large triangle, and the latter motifs are smaller triangles, which involve a rotation, linear displacement, and change of scale of the prior motif. In one embodiment, the fractal shape has some apertures in it (not illustrated) to allow the solid to be cooled to connect with other elements. Also, the solid to be cooled is connected to the fractal shape at point connector 240 and through bus wires at 250 and 260. The solid should be connected to the fractal heatsink in at least one point, either through a point connection, a bus wire connection, or some other connection. If it is desired that the solid be fixed inside the heatsink, there may be at least three connection points, as illustrated. However, only one connection point is necessary for heat convection and radiation from the solid to the heatsink. Preferably, the point or bus wire connection is built using a strong heat conductor, such as carbon nanotubes or a diamond-like coating.

Note that, as in FIG. 1, the fractal structure 210 in FIG. 2 has multiple concave regions or cavities. When a turbulently flowing fluid passes around this fractal heatsink, the concave regions or cavities substantially reduce the narrow band acoustic resonance as compared to a flat or Euclidian structure. This allows for more energy to be available to for heat transfer.

In yet another embodiment of the invention, the heatsink 210 in FIG. 3 could be constructed without the connections at points 240, 250, and 260. In one embodiment, a liquid or gas would fill the aperture 270 with the intent that the liquid or gas surround the solid to be cooled, hold it in place, or suspend it. Preferably, the liquid or gas surrounding the solid would conduct heat from the solid to the heatsink, which would then cause the heat to exit.

Those skilled in the art will recognize many ways to fabricate the heatsinks described herein. For example, modern three-dimensional laser and liquid printers can create objects such as the heatsinks described herein with a resolution of features on the order of 16 μm. Also, it is possible to grow a crystal structure using a recursive growth algorithm or through crystal growth techniques. For example, US Patent Application No. 2006/0037177 by Blum, incorporated herein by reference, describes a method of controlling crystal growth to produce fractals or other structures through the use of spectral energy patterns by adjusting the temperature, pressure, and electromagnetic energy to which the crystal is exposed. This method might be used to fabricate the heatsinks described herein. For larger heatsinks, such as those intended to be used in car radiators, traditional manufacturing methods for large equipment can be adapted to create the fractal structures described herein.

In this disclosure, we have described several embodiments of this broad invention. Persons skilled in the art will definitely have other ideas as to how the teachings of this specification can be used. It is not our intent to limit this broad invention to the embodiments described in the specification. Rather, the invention is limited by the following claims.

What is claimed is:

1. A heatsink comprising:
a heat exchange device having a plurality of heat exchange elements in a branched configuration having at least three levels of asymmetrical branching, having a fractal variation between respective branches, each heat exchange element having an asymmetric external heat exchange surface configured to transfer heat to a heat exchange medium outside of the heat exchange device;
a forced convection device configured to induce a flow of an gaseous heat exchange medium outside of the heat exchange device, wherein the induced flow is associated with acoustic emissions from an interaction of the flowing heat exchange medium with the heat exchange device; and
a flat base configured to interface the heat exchange device with a heat source.

2. The heatsink according to claim 1 wherein the heat exchange medium comprises a heat transfer fluid, and the forced convection device is configured to induce a turbulent flow of the heat transfer fluid adjacent to the external heat exchange surfaces.

3. The heatsink according to claim 1, wherein the heatsink is planar, and the plurality of heat exchange elements branch asymmetrically in two dimensions.

4. The heatsink according to claim 1, wherein the branched configuration of the plurality of heat exchange elements comprises branches which emerge from respective branch points in three dimensions.

5. The heatsink according to claim 1, wherein the heat exchange medium comprises air, and the fractal variation in the plurality of heat exchange elements substantially reduces a narrowband acoustic resonance resulting from a forced air flow over the external heat exchange surfaces of the plurality of branched heat exchange elements with respect to a corresponding plurality of heat exchange elements arranged in a regular pattern.

6. The heatsink of claim 1, wherein the heat exchange device comprises an element whose heat conductivity exceeds 850 W/(m*K).

7. The heatsink of claim 1, where the heat exchange device comprises graphene.

8. The heatsink of claim 1, where the heat exchange device comprises diamond.

9. The heatsink of claim 1, where the heat exchange device comprises a composition having an extended regular lattice which effectively supports coherent phonon transport over macroscopic distances.

10. The heatsink of claim 1, where the heat exchange device comprises aligned carbon nanotubes.

11. The heatsink of claim 1, wherein the heat exchange medium comprises a cooling fluid, and the plurality of heat exchange elements are configured to produce chaotically distributed asymmetric vortices in a convective fluid flow of the cooling fluid flowing about the heatsink.

12. The heatsink of claim 1, further comprising at least one connector, configured to connect with a solid to be cooled in at least one point.

13. The heatsink of claim 1, wherein the levels of asymmetric branching comprise a relative rotation of the respective heat exchange elements emerging from a branch to provide a three dimensional branched configuration.

14. The heatsink of claim 1, further comprising an aperture in the center of the heatsink.

15. A method of cooling a solid comprising the steps of:
connecting the solid with a heatsink comprising a heat exchange device having a plurality of heat exchange elements having an asymmetric fractal branching pattern encompassing at least three levels of branching, each heat exchange element having an external heat exchange surface;
transferring heat from the solid to the heatsink; and
dissipating the heat from the heatsink by inducing a flow of a heat transfer fluid over the respective external heat exchange surfaces of the plurality of heat exchange elements with a forced convection device, wherein the flow of the heat transfer fluid over the external heat exchange surface is associated with an acoustic emission.

16. The method according to claim 15, wherein the acoustic emission has a reduced peak narrowband acoustic resonance peaks with respect to a corresponding plurality of heat exchange elements arranged in a symmetric pattern.

17. A heatsink comprising:
a heat exchange device having a plurality of heat exchange elements each having an external surface boundary with respect to a heat transfer fluid, having an asymmetric fractal variation therebetween, and a forced convection device configured to induce a turbulent flow of the heat transfer fluid about the external surface boundary, wherein the heat transfer fluid is induced to flow with respect to the external surface boundary of the plurality of fractally varying heat exchange elements such that flow-induced vortices are generated at chaotically distributed asymmetric locations with respect to the plurality of fractally varying heat exchange elements, resulting in acoustic emissions having a reduced resonance as compared to acoustic emissions from a corresponding heat exchange device having a plurality of symmetric heat exchange elements that produce flow-induced vortices at symmetric locations on the plurality of heat exchange elements.

18. The heatsink of claim 17, further comprising a heat transfer surface adapted to receive heat by thermal diffusion from a device to be cooled.

19. The heatsink of claim 18, further comprising a thermal interface material at said heat transfer surface adapted to communicate heat between the device to the cooled and the heat exchange device.

20. The heatsink of claim 17, at least one portion the heat exchange device comprises a material having a bulk heat conductivity which exceeds 850 W/(m*K).

21. The heatsink of claim 17, where the heat exchange device comprises carbon nanotubes.

22. The heatsink of claim 17, further comprising at least one connector, designed to affix the heatsink to a solid object associated with a source of heat.

23. The heatsink of claim 17, wherein the forced convection device a pump or fan adapted to induce the turbulent flow of the heat transfer fluid with respect to the external surface boundary.

24. The heatsink of claim 17, wherein the forced convection device comprises a fan, and the plurality of heat exchange elements are configured to produce asymmetric vortices in a convective flow of the heat transfer fluid outside the external surface boundary.

25. The heatsink of claim 17, wherein the heat exchange elements each comprise a set of interconnected external solid-gas interface surfaces.

26. The heatsink of claim 17, wherein the heat transfer fluid is induced to flow outside the external surface boundary in a turbulent pattern in an acoustically non-resonant fluid flow pattern.

27. A method of cooling a solid comprising the steps of:
connecting the solid with a heatsink comprising:
a heat exchange device having an asymmetric multilevel branched array comprising, at each level of branching, a plurality of non-identically shaped heat exchange elements which have a respective physical configuration which varies according to a fractal relationship and an external heat exchange surface;
inducing a heat transfer fluid to flow over the external heat exchange surfaces of the plurality of heat exchange elements over a range of flow rates, wherein the fluid flow over the range of flow rates induces chaotically distributed asymmetric vortices adjacent to the external heat exchange surfaces of the heat exchange elements in selectively dependence on at least the respective physical configuration of the heat exchange elements, and the flow over the range of flow rates is associated with acoustic emissions.

28. The method of claim 27, wherein the vortices are substantially non-uniformly distributed about the heat exchange device.

29. The method of claim 27, wherein the fractal relationship substantially reduces narrow band acoustic resonance as compared to a corresponding heat exchange device having a linear or Euclidian geometric variation between a plurality of heat exchange elements.

30. The method of claim 27, wherein the heat transfer fluid is not encased by the heat exchange device.

31. A heatsink, comprising:
a heat conductive body having a heat exchange surface, adapted to conductively exchange heat with an object contacting the heat exchange surface;
a set of asymmetrical projections, extending from the body, comprising at least two projections each having at least two hierarchical levels of branching, wherein the proportions of each branch asymmetrically differ between different projections;
an external surface of at least a terminal branch of each projection, adapted to conductively and radiatively transfer heat, wherein a radiative heat transfer between respective terminal branches is asymmetric; and
a fan configured to induce a flow of a gaseous heat transfer fluid surrounding the set of asymmetrical projections, wherein the induced flow produces acoustic emissions,
wherein the asymmetrically differing proportions of the branches substantially reduces narrow band acoustic resonance in the heat transfer fluid flowing over the set of asymmetrical projections, as compared to a corresponding heatsink symmetric branches having symmetric differences in proportions of respective branches.

32. The heatsink according to claim 17, wherein the heat transfer fluid comprises air, wherein the induced flow by the fan is uncontained and comprises an asymmetric pattern of vortices over the set of asymmetrical projections over a range of air flow rates.

* * * * *